United States Patent
Shibata et al.

(10) Patent No.: US 10,978,635 B2
(45) Date of Patent: Apr. 13, 2021

(54) PIEZOELECTRIC ELEMENT, PIEZOELECTRIC ACTUATOR AND PIEZOELECTRIC TRANSFORMER

(71) Applicant: NGK SPARK PLUG CO., LTD., Aichi (JP)

(72) Inventors: Kiyohito Shibata, Chiba (JP); Norifumi Iwaki, Kumagaya (JP); Toru Ezaki, Saitama (JP); Toshikatsu Nomura, Nagareyama (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 512 days.

(21) Appl. No.: 15/766,907

(22) PCT Filed: Oct. 7, 2016

(86) PCT No.: PCT/JP2016/079923
§ 371 (c)(1),
(2) Date: Apr. 9, 2018

(87) PCT Pub. No.: WO2017/061592
PCT Pub. Date: Apr. 13, 2017

(65) Prior Publication Data
US 2018/0301617 A1    Oct. 18, 2018

(30) Foreign Application Priority Data

Oct. 9, 2015 (JP) .............. JP2015-201334

(51) Int. Cl.
*H01L 41/107* (2006.01)
*H01L 41/047* (2006.01)
(Continued)

(52) U.S. Cl.
CPC ........ *H01L 41/107* (2013.01); *H01L 41/0471* (2013.01); *H01L 41/0472* (2013.01);
(Continued)

(58) Field of Classification Search
CPC ....... H01L 41/107; H01L 41/09; H01L 41/27; H01L 41/0471; H01L 41/0472; H01L 41/0477; H01L 41/187
See application file for complete search history.

(56) References Cited

U.S. PATENT DOCUMENTS

2001/0054859 A1* 12/2001 Hammer ............ H01L 41/0477
                                                    310/363
2003/0020377 A1*  1/2003 Namerikawa ......... H01L 41/314
                                                    310/365
(Continued)

FOREIGN PATENT DOCUMENTS

CN      104882535 A    9/2015
JP      H05-043495 U   6/1993
(Continued)

OTHER PUBLICATIONS

The State Intellectual Property Office of People's Republic of China, First Office Action issued in corresponding Application No. 201680058982.7 dated Sep. 30, 2020.
(Continued)

*Primary Examiner* — Emily P Pham
(74) *Attorney, Agent, or Firm* — Stites & Harbison, PLLC; Jeffrey A. Haeberlin; James R. Hayne

(57) ABSTRACT

A multilayer piezoelectric element that expands and contracts in response to an applied voltage includes external electrodes disposed on surfaces of an element body, internal electrodes connected to the external electrodes, and piezoelectric layers laminated alternately with the internal electrodes. An electrode material used for the internal electrodes or the external electrodes contains a base material composed of Ag and Pd in a weight ratio of 60/40 to 85/15 and Pt in an amount of 0.1% to 10% by weight based on the weight of the base material. Also included is a piezoelectric actuator
(Continued)

including the piezoelectric element and a piezoelectric transformer including the piezoelectric element.

9 Claims, 3 Drawing Sheets

(51) Int. Cl.
  *H01L 41/09*  (2006.01)
  *H01L 41/27*  (2013.01)
(52) U.S. Cl.
  CPC .......... *H01L 41/0477* (2013.01); *H01L 41/09* (2013.01); *H01L 41/27* (2013.01)

(56) References Cited

U.S. PATENT DOCUMENTS

| | | | |
|---|---|---|---|
| 2004/0095042 A1* | 5/2004 | Sube | H01L 41/083 310/328 |
| 2007/0125977 A1 | 7/2007 | Kawamoto | |
| 2007/0176521 A1 | 8/2007 | Nakamura | |
| 2007/0205700 A1 | 9/2007 | Okamura et al. | |
| 2007/0273251 A1 | 11/2007 | Okamura et al. | |
| 2008/0303385 A1 | 12/2008 | Okamura et al. | |
| 2009/0045701 A1 | 2/2009 | Okamura et al. | |
| 2009/0045702 A1 | 2/2009 | Okamura et al. | |
| 2009/0066193 A1 | 3/2009 | Glicksman et al. | |
| 2010/0107390 A1* | 5/2010 | Yamamoto | C04B 35/493 29/25.35 |
| 2010/0209287 A1* | 8/2010 | Bennett | C22C 5/06 420/476 |
| 2010/0259132 A1 | 10/2010 | Nakamura | |
| 2011/0128665 A1* | 6/2011 | Nies | C04B 35/62685 361/301.4 |
| 2011/0169373 A1* | 7/2011 | Nakamura | H01L 41/0477 310/311 |
| 2011/0180623 A1* | 7/2011 | Kawamoto | F02M 51/0603 239/102.2 |
| 2012/0153238 A1 | 6/2012 | Glicksman et al. | |
| 2015/0243876 A1 | 8/2015 | Ozawa et al. | |
| 2016/0294306 A1* | 10/2016 | Kobayashi | H02N 2/004 |

FOREIGN PATENT DOCUMENTS

| | | |
|---|---|---|
| JP | 2003-124535 A | 4/2003 |
| JP | 2004-071905 A | 3/2004 |
| JP | 2005-150369 A | 6/2005 |
| JP | 2005-179161 A | 7/2005 |
| JP | 2005-183553 A | 7/2005 |
| JP | 2014-187061 A | 10/2014 |
| JP | 2015-122438 A | 7/2015 |
| KR | 2010-0066543 A | 6/2010 |

OTHER PUBLICATIONS

Korean Intellectual Property Office, Office Action (Notification of Reason for Refusal) issued in corresponding Application No. 10-2018-7009998 dated Jul. 26, 2019.

Japan Patent Office, International Search Report issued in corresponding Application No. PCT/JP2016/079923, dated Dec. 20, 2016.

Japan Patent Office, Written Opinion issued in corresponding Application No. PCT/JP2016/079923, dated Dec. 20, 2016 (translation not available).

Japan Patent Office, Office Action (Notification of Reasons for Refusal) issued in corresponding Application No. 2017-508702, dated Oct. 4, 2017.

\* cited by examiner

FIG. 2

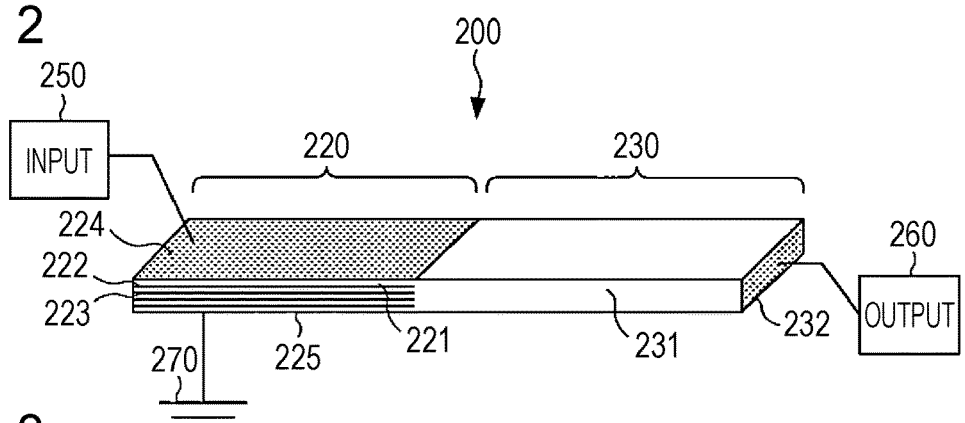

FIG. 3

| Ag/Pd(70/30) wt% | Pt wt% | DELAMINATION DURING FIRING | DIELECTRIC BREAKDOWN DUE TO MIGRATION |
|---|---|---|---|
| 100 | 0 | NO | YES |
| 100 | 0.1 | NO | NO |
| 100 | 0.5 | NO | NO |
| 100 | 1 | NO | NO |
| 100 | 3 | NO | NO |
| 100 | 5 | NO | NO |
| 100 | 8 | NO | NO |
| 100 | 10 | NO | NO |
| 100 | 12 | YES | NO |
| 100 | 15 | YES | NO |

FIG. 4

| Ag/Pd(85/15) wt% | Pt wt% | DELAMINATION DURING FIRING | DIELECTRIC BREAKDOWN DUE TO MIGRATION |
|---|---|---|---|
| 100 | 0 | NO | YES |
| 100 | 0.1 | NO | NO |
| 100 | 0.5 | NO | NO |

FIG. 5

| Ag/Pd(60/40) wt% | Pt wt% | DELAMINATION DURING FIRING | DIELECTRIC BREAKDOWN DUE TO MIGRATION |
|---|---|---|---|
| 100 | 8 | NO | NO |
| 100 | 10 | NO | NO |
| 100 | 12 | YES | NO |
| 100 | 15 | YES | NO |

FIG. 6

| Ag/Pd(70/30) wt% | Pt wt% | DELAMINATION DURING ACTUATION | DIELECTRIC BREAKDOWN DUE TO MIGRATION |
|---|---|---|---|
| 100 | 0.3 | NO | YES |
| 100 | 0.5 | NO | NO |
| 100 | 5.0 | NO | NO |
| 100 | 6.0 | YES | NO |

FIG. 7

| Ag/Pd(85/15) wt% | Pt wt% | DELAMINATION DURING ACTUATION | DIELECTRIC BREAKDOWN DUE TO MIGRATION |
|---|---|---|---|
| 100 | 0 | NO | YES |
| 100 | 0.1 | YES | NO |
| 100 | 0.5 | NO | NO |

FIG. 8

| Ag/Pd(60/40) wt% | Pt wt% | DELAMINATION DURING ACTUATION | DIELECTRIC BREAKDOWN DUE TO MIGRATION |
|---|---|---|---|
| 100 | 8 | YES | NO |
| 100 | 10 | YES | NO |
| 100 | 12 | YES | NO |
| 100 | 15 | YES | NO |

PIEZOELECTRIC ELEMENT, PIEZOELECTRIC ACTUATOR AND PIEZOELECTRIC TRANSFORMER

BACKGROUND OF THE INVENTION

Field of the Invention

The present invention relates to multilayer piezoelectric elements, piezoelectric actuators, and piezoelectric transformers that expand and contract in response to an applied voltage.

Description of Related Art

Conventionally, silver (Ag)-based materials such as Ag and silver/palladium (Ag/Pd) are often used for electrodes in piezoelectric elements because of their characteristics, ease of use, and cost. Such Ag-based electrode materials have a problem in that Ag migrates and causes dielectric degradation.

For example, patent document 1 discloses a piezoelectric element including stress-relieving layers formed of a material to which a hardening element is added to reduce the mobility of metal cations and halogen anions in the stress-relieving layers.

Patent document 2 discloses a ceramic heater including an anti-migration conductor pattern that traps migrating impurity elements such as Na, Mg, K, and Ca and oxygen ions to reduce the change in the electrical resistance of a resistive heating element to a low level, thereby preventing abnormal heating.

RELATED ART DOCUMENTS

Patent Document 1 is Japanese Unexamined Patent Application Publication No. 2014-187061.
Patent Document 2 is Japanese Unexamined Utility Model Registration Application Publication No. 5-43495.

BRIEF SUMMARY OF INVENTION

According to the above literature, a special material or a special electrode pattern is used in an area where a voltage is to be applied to inhibit characteristic migration at the sacrifice of the intrinsic performance. Thus, depending on the use of such a material or pattern, it may be impossible to ensure sufficient performance. Although the use of platinum (Pt) for electrodes, for example, is also mentioned, the idea of adjusting the composition of an electrode material to inhibit the migration of metals is not found.

The present invention has been made in view of these circumstances. An object of the present invention is to provide a piezoelectric element, piezoelectric actuator, piezoelectric transformer, and electrode material in which the migration of Ag can be hindered to achieve an extended life while maintaining good characteristics for a long period of time.

(1) To achieve the above object, a piezoelectric element according to the present invention is a multilayer piezoelectric element that expands and contracts in response to an applied voltage and includes external electrodes disposed on surfaces of an element body, internal electrodes connected to the external electrodes, and piezoelectric layers laminated alternately with the internal electrodes. In other words, an element body includes internal electrodes and piezoelectric layers laminated alternately with the internal electrodes, and external electrodes disposed on surfaces of the element body are connected to the internal electrodes. An electrode material used for the internal electrodes or the external electrodes contains a base material composed of Ag and Pd in a weight ratio of 60/40 to 85/15 and Pt in an amount of 0.1% to 10% by weight based on the weight of the base material.

This hinders the migration of Ag, so that Ag does not ionize and diffuse through the ceramic or across the surface thereof. As a result, dielectric degradation can be inhibited, and the life of the piezoelectric element can be extended. In addition, good characteristics can be maintained for a long period of time.

(2) In the piezoelectric element according to the present invention, the electrode material contains Pt in an amount of 0.5% to 5.0% by weight based on the weight of the base material. This inhibits the migration of Ag more effectively.

(3) In the piezoelectric element according to the present invention, the internal electrodes are separated from each other by a distance of 30 to 500 µm. This hinders the migration of Ag while improving the characteristics of the piezoelectric element.

(4) A piezoelectric actuator according to the present invention includes an actuator body formed by coupling, in series, piezoelectric elements according to (1), (2), or (3) above and lead members electrically connecting the coupled piezoelectric elements together. This provides a piezoelectric actuator with high durability.

(5) A piezoelectric transformer according to the present invention includes the piezoelectric element according to (1), (2), or (3) above. The piezoelectric element increases or decreases a voltage input to a primary side and outputs the voltage from a secondary side. In other words, an input voltage applied to the primary side of the piezoelectric element is increased or decreased and output from the secondary side of the piezoelectric element. This provides a piezoelectric transformer that can maintain good performance.

According to the present invention, the migration of Ag can be hindered to achieve an extended life while maintaining good characteristics for a long period of time.

BRIEF DESCRIPTION OF THE DRAWINGS

Illustrative aspects of the invention will be described in detail with reference to the following figures wherein:

FIG. 2 is a perspective view showing a piezoelectric element according to the present invention.

FIG. 3 is a table showing the compositions of electrodes formed using Ag/Pd (70/30) as a base material and the results of a 1,000-hour continuous actuation test.

FIG. 4 is a table showing the compositions of electrodes formed using Ag/Pd (85/15) as a base material and the results of a 1,000-hour continuous actuation test.

FIG. 5 is a table showing the compositions of electrodes formed using Ag/Pd (60/40) as a base material and the results of a 1,000-hour continuous actuation test.

FIG. 6 is a table showing the compositions of electrodes formed using Ag/Pd (70/30) as a base material and the results of a 100,000,000-cycle continuous actuation test.

FIG. 7 is a table showing the compositions of electrodes formed using Ag/Pd (85/15) as a base material and the results of a 100,000,000-cycle continuous actuation test.

FIG. 8 is a table showing the compositions of electrodes formed using Ag/Pd (60/40) as a base material and the results of a 100,000,000-cycle continuous actuation test.

DETAILED DESCRIPTION OF EXEMPLARY EMBODIMENTS OF THE INVENTION

Piezoelectric Element for Piezoelectric Actuator

Figure 1:
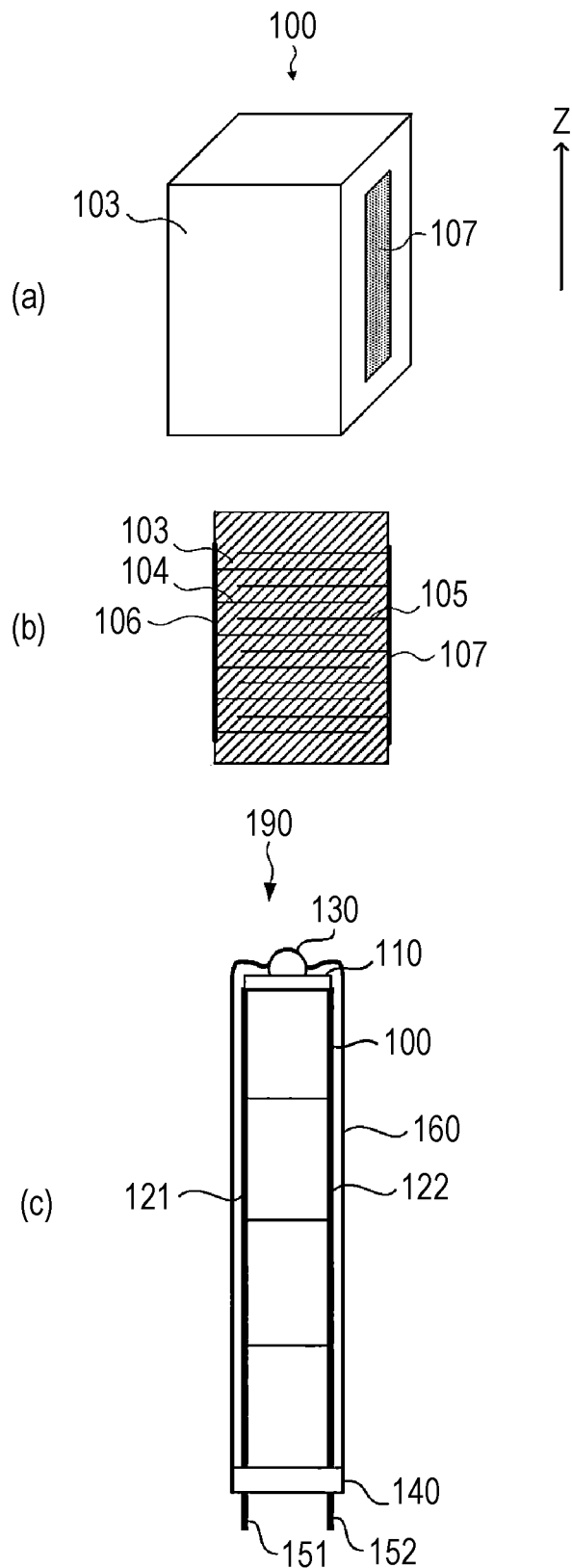
FIG. 1(a) and FIG. 1(b) are a perspective view and a side sectional view, respectively, showing a piezoelectric element according to the present invention.
FIG. 1(c) is a side sectional view showing a piezoelectric actuator.

FIGS. 1(a) and 1(b) are a perspective view and a side sectional view, respectively, showing a piezoelectric element 100. The piezoelectric element 100 is a multilayer piezoelectric element formed in a rectangular shape and including piezoelectric layers 103 and internal electrodes 104 and 105 laminated alternately with each other in the lamination direction Z. The piezoelectric element 100 expands and contracts in response to a voltage applied to the internal electrodes 104 and 105. The piezoelectric layers 103 are formed of, for example, a piezoelectric material such as PZT and are polarized in alternating orientations in the thickness direction.

The internal electrodes 104 and 105 are routed to opposing element side surfaces and are connected to the external electrodes 106 and 107, respectively, so that different voltages can be applied to the adjacent internal electrodes 104 and 105 through the external electrodes 106 and 107. As a voltage is applied to the internal electrodes 104 and 105, the individual piezoelectric layers 103 expand and contract, and accordingly, the entire piezoelectric element expands and contracts. The piezoelectric element 100 need not be rectangular, but may be of various shapes.

The electrode material used for the internal electrodes 104 and 105 or the external electrodes 106 and 107 contains silver (Ag)/palladium (Pd) as a base material and platinum (Pt) in an amount of 0.1% to 10% by weight. This hinders the migration of Ag, so that Ag does not ionize and diffuse through the ceramic or across the surface thereof. As a result, dielectric degradation can be inhibited, and the life of the piezoelectric element 100 can be extended. In addition, good characteristics can be maintained for a long period of time.

The base material used for the electrode material is preferably Ag/Pd in a weight ratio of 60/40 to 85/15. Although Pt is preferred as a component present in the electrodes, Pt may be replaced with ruthenium (Ru), rhodium (Rh), osmium (Os), or iridium (Ir).

More preferably, the electrode material contains Pt in an amount of 0.5% to 5.0% by weight. This inhibits the migration of Ag more effectively. Such compositions are particularly effective if the internal electrodes 104 and 105 are separated from each other by a distance of 30 to 500 μm. This hinders the migration of Ag while improving the characteristics of the piezoelectric element 100.

FIG. 1(c) is a side sectional view showing a piezoelectric actuator 190. The piezoelectric actuator 190 is a piezoelectric actuator 190 for a positioner and includes a piezoelectric actuator body 110 fitted and sealed in a cap 160. In FIG. 1(c), only the cap 160 is shown in cross-section, and the piezoelectric actuator body 110 is shown in side view.

The piezoelectric actuator body 110 is formed by bonding piezoelectric elements 100 in series in the lamination direction Z. Lead members 121 and 122 formed of a metal are bonded to the external electrodes 106 and 107, respectively, and are connected to terminals 151 and 152, respectively, at a seat 140.

As a voltage is applied to the terminals 151 and 152 of the piezoelectric actuator 190, the piezoelectric actuator body 110 expands and contracts, and accordingly, the cap 160, which abuts a tip 130, comes into contact with the object to be actuated, such as a stage. As a result, the object to be actuated can be precisely actuated and positioned. Thus, a piezoelectric actuator 190 capable of precise actuation and having high durability can be provided. In addition, the piezoelectric actuator 190 is resistant to water vapor and is therefore suitable for applications such as piezoelectric actuators for textile machinery, piezoelectric actuators for inkjet systems, and piezoelectric actuators for injection of fuel into automotive engines.

Method for Manufacturing Piezoelectric Actuator

Internal electrodes are first printed on piezoelectric ceramic green sheets with an Ag/Pd electrode paste to which Pt is added. The green sheets are then laminated and pressed together, and the piezoelectric layers 103 are co-fired with the internal electrodes 104 and 105. The external electrodes 106 and 107 can be formed by printing and baking the electrode paste on the side surfaces of the resulting fired body in the lamination direction such that the external electrodes 106 and 107 are connected to the internal electrodes 104 and 105. The thus-obtained fired body is subjected to polarization treatment to obtain the piezoelectric element 100.

The piezoelectric actuator body 110 is fabricated by coupling, in series, a plurality of thus-obtained piezoelectric elements 100 by bonding with an adhesive, such as epoxy, applied to the end surfaces of the piezoelectric elements 100. The lead members 121 and 122 are then bonded to the external electrodes 106 and 107, respectively, with a bonding material such as solder and are connected to the terminals 151 and 152, respectively, at the seat 140. The piezoelectric actuator body 110 is then fitted and sealed in the cap 160. The piezoelectric actuator 190 can thus be fabricated.

Piezoelectric Element for Piezoelectric Transformer

FIG. 2 is a perspective view showing a piezoelectric element 200 for a piezoelectric transformer. The piezoelectric element 200, which is formed in a rectangular shape, converts (increases or decreases) an input voltage applied to a primary side through an input terminal 250 and outputs the converted voltage to an output terminal 260 on a secondary side.

An input section 220 is formed by laminating piezoelectric layers 221 and internal electrodes 222 and 223 alternately with each other. Routing electrodes for the internal electrodes 222 and 223 of the piezoelectric element 200 are connected on the element side surfaces to external electrodes 224 and 225. The piezoelectric layers 221 are formed of, for example, a piezoelectric material such as PZT. The piezoelectric layers 221 are all polarized in the thickness direction. The external electrode 224 (input electrode) is connected to the input terminal 250, whereas the external electrode 225 is connected to a ground 270. The internal electrodes 222 and 223 and the external electrodes 224 and 225 are formed of Ag/Pt. A piezoelectric layer 231 is polarized in the longitudinal direction.

An output section 230 is composed of the piezoelectric layer 231 and an end electrode 232 (external electrode). The end external electrode 232 is connected to the output terminal 260. As an input voltage is applied to the piezoelectric element 200 as described above, a predetermined vibration mode is excited, thus converting the input voltage and outputting the voltage. This piezoelectric element 200 is effective for use as a piezoelectric transformer in a circuit, such as a medical power supply unit, where the influence of electromagnetism should be avoided.

Method for Manufacturing Piezoelectric Transformer

Internal electrodes are first printed on piezoelectric ceramic green sheets with an Ag/Pt electrode paste, and the green sheets are laminated and processed into a rectangular shape. Internal electrodes are then provided, and an end electrode is provided at the end on the output side, depending on the design of the input and output sections. Thus, the electrode paste is applied to the predetermined areas of the outer surfaces of the element by screen printing and is baked to form external electrodes. The resulting fired body is subjected to polarization treatment, and leads are soldered to the external electrodes 224, 225, and 232.

As an alternating voltage with a frequency substantially identical to the mechanical resonant frequency in the longitudinal direction is applied between the internal electrodes 222 and 223 of the piezoelectric element 200, strong mechanical vibrations are excited in the longitudinal direction of the piezoelectric element 200, and the piezoelectric effect produces a high voltage at the external electrode 232.

Piezoelectric elements for piezoelectric actuators as described above were fabricated with different compositions for internal and external electrodes, and piezoelectric actuators 190 for positioners were assembled. The piezoelectric actuators 190 were then subjected to a continuous actuation test with a DC voltage of 150 V at 180° C. for 1,000 hours. FIGS. 3 to 5 are tables showing the compositions of electrodes formed using Ag/Pd (70/30), Ag/Pd (85/15), and Ag/Pd (60/40), respectively, as a base material and the results of the 1,000-hour continuous actuation test. The ratios in parentheses are by weight (the same applies hereinafter).

As shown in FIG. 3, the use of Ag/Pd (70/30) electrodes to which no Pt was added caused dielectric breakdown due to migration. The use of electrodes to which Pt was added in amounts of 0.1% to 10% by weight based on 100% by weight of Ag/Pd (70/30) did not cause delamination during firing or dielectric breakdown due to migration. In contrast, the use of electrodes to which Pt was added in amounts of 12% and 15% by weight based on 100% by weight of Ag/Pd (70/30) did not cause dielectric breakdown due to migration but caused delamination during firing.

As shown in FIG. 4, the use of Ag/Pd (85/15) electrodes to which no Pt was added caused dielectric breakdown due to migration. The use of electrodes to which Pt was added in amounts of 0.1% and 0.5% by weight based on 100% by weight of Ag/Pd (85/15) did not cause delamination during firing or dielectric breakdown due to migration.

As shown in FIG. 5, the use of electrodes to which Pt was added in amounts of 8% and 10% by weight based on 100% by weight of Ag/Pd (60/40) did not cause delamination during firing or dielectric breakdown due to migration. In contrast, the use of electrodes to which Pt was added in amounts of 12% and 15% by weight based on 100% by weight of Ag/Pd (60/40) caused delamination during firing.

The above results demonstrate that a piezoelectric element including electrodes containing a base material composed of Ag and Pd in a weight ratio of 60/40 to 85/15 and Pt in an amount of 0.1% to 10% by weight based on the weight of the base material has good durability.

Furthermore, piezoelectric elements for piezoelectric actuators as described above were fabricated with slightly different electrode compositions within the range of compositions that provided good durability in the above test and were subjected to a continuous actuation test with a rectangular voltage of 150 V. FIGS. 6 to 8 are tables showing the compositions of electrodes formed using Ag/Pd (70/30), Ag/Pd (85/15), and Ag/Pd (60/40), respectively, as a base material and the results of the 100,000,000-cycle continuous actuation test.

As shown in FIG. 6, the use of electrodes to which Pt was added in an amount of 0.3% by weight based on 100% by weight of Ag/Pd (70/30) caused dielectric breakdown due to migration. The use of electrodes to which Pt was added in an amount of 0.5% by weight based on 100% by weight of Ag/Pd (70/30) did not cause delamination during actuation or dielectric breakdown due to migration.

In contrast, the use of electrodes to which Pt was added in an amount of 6.0% by weight based on 100% by weight of Ag/Pd (70/30) did not cause dielectric breakdown due to migration but caused delamination during actuation. The use of electrodes to which Pt was added in an amount of 5.0% by weight based on 100% by weight of Ag/Pd (70/30) did not cause delamination during actuation or dielectric breakdown due to migration.

As shown in FIG. 7, the use of Ag/Pd (85/15) electrodes to which no Pt was added caused dielectric breakdown due to migration. The use of electrodes to which Pt was added in an amount of 0.1% by weight based on 100% by weight of Ag/Pd (85/15) did not cause dielectric breakdown due to migration but caused delamination during actuation. The use of electrodes to which Pt was added in an amount of 0.5% by weight based on 100% by weight of Ag/Pd (85/15) did not cause delamination during actuation or dielectric breakdown due to migration.

As shown in FIG. 8, the use of electrodes to which Pt was added in amounts of 8%, 10%, 12%, and 15% by weight based on 100% by weight of Ag/Pd (60/40) did not cause dielectric breakdown due to migration but caused delamination during actuation.

The above results demonstrate that a piezoelectric element including electrodes containing a base material composed of Ag and Pd in a weight ratio of 60/40 to 85/15 and Pt in an amount of 0.5% to 5% by weight has a better durability.

DESCRIPTION OF REFERENCE NUMERALS

100: piezoelectric element
103: piezoelectric layer
104, 105: internal electrode
106, 107: external electrode
110: piezoelectric actuator body
121, 122: lead member
130: tip
140: seat
151, 152: terminal
160: cap
190: piezoelectric actuator
200: piezoelectric element
220: input section
221: piezoelectric layer
222, 223: internal electrode
224, 225, 232: external electrode
230: output section
231: piezoelectric layer
250: input terminal
260: output terminal
270: ground

What is claimed is:

1. A multilayer piezoelectric element that expands and contracts in response to an applied voltage, the piezoelectric element comprising:
an element body including internal electrodes and piezoelectric layers laminated alternately with the internal electrodes; and
external electrodes disposed on surfaces of the element body, the external electrodes connected to the internal electrodes,
wherein an electrode material used for the internal electrodes or the external electrodes contains a base material comprising Ag and Pd in a weight ratio of 60/40 to 85/15 and Pt in an amount of 0.1% to 10% by weight based on the weight of the base material.

2. The piezoelectric element according to claim 1, wherein the electrode material contains Pt in an amount of 0.5% to 5.0% by weight based on the weight of the base material.

3. The piezoelectric element according to claim 2, wherein the internal electrodes are separated from each other by a distance of 30 to 500 μm.

4. A piezoelectric actuator comprising:
an actuator body formed by coupling, in series, a plurality of piezoelectric elements, each of the piezoelectric elements including
an element body including internal electrodes and piezoelectric layers laminated alternately with the internal electrodes, and
external electrodes disposed on surfaces of the element body, the external electrodes connected to the internal electrodes; and
lead members electrically connecting the coupled piezoelectric elements together,
wherein an electrode material used for the internal electrodes or the external electrodes contains a base material comprising Ag and Pd in a weight ratio of 60/40 to 85/15 and Pt in an amount of 0.1% to 10% by weight based on the weight of the base material.

5. A piezoelectric transformer comprising:
a piezoelectric element having a primary side and a secondary side, the piezoelectric element including
an element body including internal electrodes and piezoelectric layers laminated alternately with the internal electrodes, and
external electrodes disposed on surfaces of the element body, the external electrodes connected to the internal electrodes,
wherein
an electrode material used for the internal electrodes or the external electrodes contains a base material comprising Ag and Pd in a weight ratio of 60/40 to 85/15 and Pt in an amount of 0.1% to 10% by weight based on the weight of the base material, and
an input voltage applied to the primary side of the piezoelectric element is increased or decreased and output from the secondary side of the piezoelectric element.

6. The piezoelectric actuator according to claim 4, wherein the electrode material contains Pt in an amount of 0.5% to 5.0% by weight based on the weight of the base material.

7. The piezoelectric actuator according to claim 6, wherein the internal electrodes are separated from each other by a distance of 30 to 500 μm.

8. The piezoelectric actuator according to claim 5, wherein the electrode material contains Pt in an amount of 0.5% to 5.0% by weight based on the weight of the base material.

9. The piezoelectric actuator according to claim 8, wherein the internal electrodes are separated from each other by a distance of 30 to 500 μm.

* * * * *